US009769955B2

(12) United States Patent
Teraki et al.

(10) Patent No.: US 9,769,955 B2
(45) Date of Patent: Sep. 19, 2017

(54) REFRIGERATING APPARATUS

(71) Applicant: DAIKIN INDUSTRIES, LTD., Osaka-shi, Osaka (JP)

(72) Inventors: Junichi Teraki, Shiga (JP); Akihiko Oguri, Shanghai (CN)

(73) Assignee: Daikin Industries, Ltd., Osaka (JP)

( * ) Notice: Subject to any disclaimer, the term of this patent is extended or adjusted under 35 U.S.C. 154(b) by 259 days.

(21) Appl. No.: 14/395,644

(22) PCT Filed: Apr. 26, 2013

(86) PCT No.: PCT/JP2013/002862
§ 371 (c)(1),
(2) Date: Oct. 20, 2014

(87) PCT Pub. No.: WO2013/161323
PCT Pub. Date: Oct. 31, 2013

(65) Prior Publication Data
US 2015/0082822 A1   Mar. 26, 2015

(30) Foreign Application Priority Data

Apr. 27, 2012   (JP) .................................. 2012-103724

(51) Int. Cl.
*F25D 23/12* (2006.01)
*H05K 7/20* (2006.01)
(Continued)

(52) U.S. Cl.
CPC ............. *H05K 7/2029* (2013.01); *F24F 1/24* (2013.01); *F25B 31/006* (2013.01);
(Continued)

(58) Field of Classification Search
CPC ... F24F 1/21; F24F 1/22; F25B 31/006; F25B 2700/21153; F25B 13/00
See application file for complete search history.

(56) References Cited

U.S. PATENT DOCUMENTS

| 2002/0105785 A1* | 8/2002 | Davis | ................ H01L 23/4006 361/703 |
| 2003/0146018 A1* | 8/2003 | Sinkunas | ............... H05K 3/225 174/254 |

(Continued)

FOREIGN PATENT DOCUMENTS

| CN | 102016432 A | 4/2011 |
| EP | 2 293 329 A1 | 3/2011 |

(Continued)

OTHER PUBLICATIONS

International Search Report issued in PCT/JP2013/002862, mailed on Jul. 16, 2013.
(Continued)

*Primary Examiner* — Elizabeth Martin
(74) *Attorney, Agent, or Firm* — Birch, Stewart, Kolasch & Birch, LLP

(57) ABSTRACT

A printed board on which a power module is mounted, a cooling pipe that is a refrigerant pipe of a refrigerant circuit, and a cooler attached to the power module and the cooling pipe are disposed in a casing. A support member by which the cooler is attached to the printed board and supported on the printed board, and a fixing member by which the printed board is fixed to the casing and supported on the casing are used.

17 Claims, 9 Drawing Sheets

(51) Int. Cl.
*F24F 1/24* (2011.01)
*F25B 31/00* (2006.01)
*H01L 23/473* (2006.01)
*H05K 1/02* (2006.01)
*F25B 13/00* (2006.01)
*H05K 3/22* (2006.01)
*H05K 3/30* (2006.01)
*H05K 3/34* (2006.01)

(52) U.S. Cl.
CPC ............ *H01L 23/473* (2013.01); *H05K 1/02* (2013.01); *H05K 1/0271* (2013.01); *H05K 7/20936* (2013.01); *F25B 13/00* (2013.01); *F25B 2313/0254* (2013.01); *F25B 2700/21153* (2013.01); *H01L 2924/0002* (2013.01); *H05K 1/0203* (2013.01); *H05K 3/22* (2013.01); *H05K 3/306* (2013.01); *H05K 3/3468* (2013.01); *H05K 2201/09063* (2013.01); *H05K 2201/09127* (2013.01); *H05K 2201/10409* (2013.01); *H05K 2203/044* (2013.01)

(56) References Cited

U.S. PATENT DOCUMENTS

| | | | |
|---|---|---|---|
| 2011/0079033 A1* | 4/2011 | Okuda | F24F 1/22 62/259.2 |
| 2011/0126568 A1 | 6/2011 | Okuda et al. | |
| 2014/0190196 A1 | 7/2014 | Okuda et al. | |

FOREIGN PATENT DOCUMENTS

| | | |
|---|---|---|
| JP | 2010-025515 A | 2/2010 |
| JP | 2010-118606 A | 5/2010 |

OTHER PUBLICATIONS

Extended European Search Report issued in corresponding European Application No. 13781690.6 on Oct. 7, 2016.

* cited by examiner

REFRIGERATING APPARATUS

TECHNICAL FIELD

The present invention relates to refrigerating apparatuses having a cooler attached to a refrigerant pipe to cool a heat generating component.

BACKGROUND ART

Refrigerating apparatuses having a cooler that is attached to a refrigerant pipe of a refrigerant circuit to cool a heat generating component, such as a power module, by a refrigerant flowing in the refrigerant pipe, have been used (see, for example, Patent Document 1).

In the air conditioner of Patent Document 1, a board on which a heat generating component is provided and a metal cooler attached to a refrigerant pipe so as to cover part of the refrigerant pipe are supported on a casing of an outdoor unit by being attached to a switch box fixed to the inside of the casing. Specifically, a through hole is formed in one of side plates of the switch box. A heat transfer plate is attached to the outside of the side plate to close the through hole, and the board is attached to the inside of the side plate in parallel with the heat transfer plate. Further, a heat generating component provided on the board is attached to an inner surface of the heat transfer plate, and the cooler is attached to an outer surface of the heat transfer plate. In this configuration, heat dissipated from the heat generating component is absorbed into the refrigerant flowing in the refrigerant pipe by way of the heat transfer plate, the cooler, and the refrigerant pipe. As a result, the heat generating component is cooled.

As described, in the above air conditioner, the board and the cooler are attached to the switch box, and the switch box is fixed to the casing, thereby making the board and the cooler supported on the casing. Further, in the above air conditioner, since the cooler and the board are attached to the switch box, even when vibrations of the compressor in the refrigerant circuit are transmitted to the cooler through the refrigerant pipe during an operation, the vibrations are transmitted not only to the heat generating component, but also to the board, thereby preventing an excess load from being applied to a lead line of the heat generating component.

CITATION LIST

Patent Document

Patent Document

Patent Document 1: Japanese Unexamined Patent Publication No. 2010-25515

SUMMARY OF THE INVENTION

Technical Problem

However, in the above air conditioner, a process of attaching the board to the switch box is necessary, and the attachment process is carried out during a process of assembling components to the board. Specifically, the board is fastened to the switch box by screws, with the lead line of the heat generating component, which is fastened to the heat transfer plate by screws, being inserted in the through hole, and thereafter, the lead line of the heat generating component is soldered. This means that the soldering must be done within the switch box, and the process of assembling components takes time and effort and is difficult. Further, installment of the board in the casing is difficult, since the board is attached to the bulky switch box, and the switch box needs to be inserted in the casing, while avoiding contact with the refrigerant pipe, etc. After the insertion, the switch box interrupts the view of the worker, which makes the subsequent installment process difficult.

The present invention is thus intended to simplify a process of assembling components to a board and an installment process of the board, in a refrigerating apparatus having a cooler attached to a refrigerant pipe to cool a heat generating component.

Solution to the Problem

The first aspect of the present invention is a refrigerating apparatus having a refrigerant circuit (10) which performs a refrigeration cycle by circulating a refrigerant; a board (51) on which a heat generating component (53) is mounted; a cooler (60) attached to the heat generating component (53) and a refrigerant pipe (15) of the refrigerant circuit (10), for cooling the heat generating component (53) with the refrigerant flowing in the refrigerant pipe (15); and a casing (40) in which at least the board (51), the refrigerant pipe (15), and the cooler (60) are disposed, the refrigerating apparatus comprising: a support member (63) by which the cooler (60) is attached to the board (51) and supported on the board (51); and a fixing member (55) by which the board (51) is fixed to the casing (40) and supported on the casing (40).

In the first aspect of the present invention, the cooler (60) is attached to the board (51) by the support member (63), and the board (51) is attached to the casing (40) by the fixing member (55), thereby making the cooler (60) and the board (51) attached to the casing (40). Further, since the cooler (60) attached to the refrigerant pipe (15) and the heat generating component (53) is attached to the board (51) by the support member (63), even when vibrations of the compressor is transmitted to the cooler (60) through the refrigerant pipe (15) during operation, the heat generating component (53) and the board (51) vibrate in the same manner, and an excess load is not applied to the lead line (54) of the power module (53). This means that the cooler (60) and the board (51) can be supported on the casing (40) without a switch box of conventional cases interposed therebetween, and an excess load is not applied to the lead line (54) of the power module (53). In this structure, in assembling various components to the board (51), the various components do not need to be assembled within the switch box. Moreover, it is not necessary to insert the bulky switch box in the casing (40) in installing the board (51) in the casing (40). Thus, the process of assembling components to the board (51) does not take time and effort, and the process of installing the board (51) does not become difficult.

The second aspect of the present invention is that in the first aspect of the present invention, a plurality of electronic components including the heat generating component (53) are mounted on the board (51), and the plurality of electronic components are disposed on a first surface of the board (51), and include a lead line (54) which passes through the board (51) from the first surface to a second surface opposite to the first surface and is soldered to the second surface via a soldered portion (56).

In the second aspect of the present invention, all the electronic components are mounted on one side, i.e., the first surface, of the board (51), and the lead line (54) passes through the board (51) and is soldered to the opposite side, i.e., the second surface, of the board (51) via the soldered portion (56). That is, only one side, i.e., the second surface, of the board (51) is a soldering surface.

The third aspect of the present invention is that in the second aspect of the present invention, the support member (63) is made of a metal material, and includes an attachment portion (66) that is attached to the cooler (60) on the first surface of the board (51), and a support portion (67) that is continuous with the attachment portion (66), passes through the board (51), and is soldered to the second surface of the board (51) via a soldered portion (69).

In the third aspect of the present invention, similarly to the plurality of electronic components, the support member (63) is attached to the board (51) by being soldered to the second surface of the board (51) via the soldered portion (69). That is, the plurality of electronic components are mounted on the board (51), and the support member (63) is fixed to the board (51), using only one side, i.e., the second surface, of the board (51) as a soldering surface.

The fourth aspect of the present invention is that in the third aspect of the present invention, the support portion (67) passes through a ground layer (57) of the board (51).

In the fourth aspect of the present invention, the support member (63) becomes conductive with a ground layer (57) of the board (51) when the support portion (67) of the support member (63) passing through the ground layer is soldered to the second surface of the board (51) via the soldered portion (69). As a result, the cooler (60) attached to the board (51) by the support member (63) is grounded.

The fifth aspect of the present invention is that in the third or fourth aspect of the present invention, the support portion (67) includes a retaining portion (68) which prevents the support portion (67) from coming off from the board (51).

In the fifth aspect of the present invention, the support portion (67) has a retaining portion (68). Thus, in soldering the second surface of the board (51) by dipping it in the soldering pot of the flow furnace, the support member (63) is not separated from the board (51), and the heat generating component (53), as well, is not separated from the board (51) since being attached to the support member (63).

The sixth aspect of the present invention is that in any one of the second to fifth aspects of the present invention, the heat generating component (53) and the support member (63) are attached to a surface of the cooler (60) facing the board (51) by screws (92, 93) inserted from the board (51) side, and a small hole (51a) is formed in the board (51) at a location corresponding to the screws (92, 93).

The seventh aspect of the present invention is that in any one of the second to fifth aspects of the present invention, the heat generating component (53) and the support member (63) are attached to a surface of the cooler (60) facing the board (51) by screws (92, 93) inserted from the board (51) side, and a cut line (51b) for breaking the board (51) and forming a through hole is formed in the board (51) at a location corresponding to the screws (92, 93).

In this structure in which the heat generating component (53) and the support member (63) are attached to the cooler (60) by the screws (92, 93) inserted from the board (51) side as described above, the heat generating component (53) and the support member (63) can be easily screwed to the cooler (60) at the time of component assembly by screwing them before attachment to the board (51), but at the time of maintenance after the component assembly, the board (51) may interrupt the access of a screwdriver to the screws (92, 93), and the cooler (60) may not be easily detached.

One way of avoiding this may be forming a through hole for insertion of a screwdriver in the board (51) at a location corresponding to the screws (92, 93). However, in the structure in which soldering is performed on the second surface of the board (51) by dipping the second surface in the melted solder in the soldering pot, using the flow furnace, as described above, the melted solder may flow out to the first surface through the through hole for insertion of the screwdriver and damage the electronic components, or the solder may adhere to a portion where soldering is not necessary. Alternatively, the through hole for insertion of the screwdriver is not formed at the time of assembly, and is formed in the board (51) at the time of maintenance. In this case, the board (51) needs to be marked because a portion of the board (51) which precisely corresponds to the screws (92, 93) cannot be known after the assembly.

In view of this, in the sixth aspect of the present invention, a small hole (51a) is formed in the board (51) at a location corresponding to the screws (92, 93). It is therefore possible to reduce the melted solder flowing out to the first surface during soldering because the diameter of the hole is small, and the through hole for insertion of the screwdriver is formed at the time of maintenance by increasing the diameter of the small hole (51a) as a mark by drilling.

In the seventh aspect of the present invention, a cut line (51b) for breaking the board (51) and forming a through hole is formed in the board (51) at a location corresponding to the screws (92, 93). It is therefore possible to reduce the melted solder flowing out to the first surface during the soldering because a hole is not formed, and the through hole for insertion of the screwdriver is formed at the time of maintenance by breaking a portion surrounded by the cut line (51b) along the cut line (51b).

The eighth aspect of the present invention is that in any of the first to seventh aspect of the present invention, the refrigerant pipe (15) is a liquid pipe of the refrigerant circuit (10).

In the eighth aspect of the present invention, the heat generating component (53) is cooled by the liquid refrigerant of the refrigerant circuit (10) which flows in the refrigerant pipe (15) of the cooler (60).

Advantages of the Invention

According to the first aspect of the present invention, the cooler (60) attached to the refrigerant pipe (15) and the heat generating component (53) is attached to the board (51) by the support member (63), and the board (51) is attached to the casing (40) by the fixing member (55). Thus, the cooler (60) and the board (51) can be supported on the casing (40) without a switch box of conventional cases interposed therebetween, and an excess load is not applied to the lead line (54) of the heat generating component (53). As a result, various components do not need to be assembled within the switch box as in the conventional cases, and therefore, it is possible to simplify the process of assembling components to the board (51). Further, since it is not necessary to provide a switch box in the casing (40), the board (51) can be easily installed without a difficult insertion work and without interruption of the view of the worker by the switch box. Thus, the process of assembling the components to the board (51) and its installment process can be significantly simplified.

According to the second aspect of the present invention, since the plurality of electronic components are placed on only one side, i.e., the second surface, of the board (51) as a soldering surface, all the electronic components can be easily mounted on the board (51), using the flow furnace. The process of assembling the components to the board can therefore be simplified.

According to the third aspect of the present invention, the support member (63) is attached to the board (51) by being soldered to the second surface of the board (51) via the soldered portion (69), similarly to the plurality of electronic components. Thus, the support member (63) and the plurality of electronic components can be fixed to the board (51) by soldering them to only one side, i.e., the second surface, of the board (51). That is, since the support member (63) and the plurality of electronic components can be easily fixed to the board (51), using the flow furnace, the process of assembling the components to the board (51) can be simplified.

According to the fourth aspect of the present invention, the support portion (67) of the support member (63) which passes through the board (51) and is soldered to the board (51) via the soldered portion (69), passes through a ground layer (57) of the board (51). The support member (63) can therefore be conductive with the ground layer (57) of the board (51), and the cooler (60) attached to the board (51) by the support member (63) can be reliably grounded.

According to the fifth aspect of the present invention, the support portion (67) includes a retaining portion (68) which prevents the support portion (67) from coming off from the board (51). Thus, in soldering the second surface of the board (51) by dipping it in the soldering pot of the flow furnace, separation of the support member (63) and the heat generating component (53) from the board (51) can be prevented. The support member (63) and the heat generating component (53) can therefore be reliably fixed to the board (51) by soldering.

According to the sixth aspect of the present invention, since a small hole (51a) is formed in the board (51) at a location corresponding to the screws (92, 93), a through hole for insertion of the screwdriver can be easily formed at the time of maintenance by increasing the diameter of the small hole (51a) as a mark by drilling, for example. Further, according to the seventh aspect of the present invention, since a cut line (51b) for breaking the board (51) and forming a through hole is formed in the board (51) at a location corresponding to the screws (92, 93), the through hole for insertion of the screwdriver can be easily formed at the time of maintenance by breaking a portion surrounded by the cut line (51b) along the cut line (51b). Thus, according to the sixth and seventh aspects of the present invention, it is possible to reduce the melted solder flowing out to the first surface because a through hole with a large diameter in which a screwdriver can be inserted is not formed at the time of soldering, and the cooler (60) can be easily detached using the through hole for insertion of the screwdriver easily formed at the time of maintenance.

According to the eighth aspect of the present invention, since the refrigerant pipe (15) to which the cooler (60) is attached is a liquid pipe of the refrigerant circuit (10), the heat generating component (53) can be sufficiently cooled by the liquid refrigerant in the refrigerant circuit (10).

DESCRIPTION OF EMBODIMENTS

Figure 1:
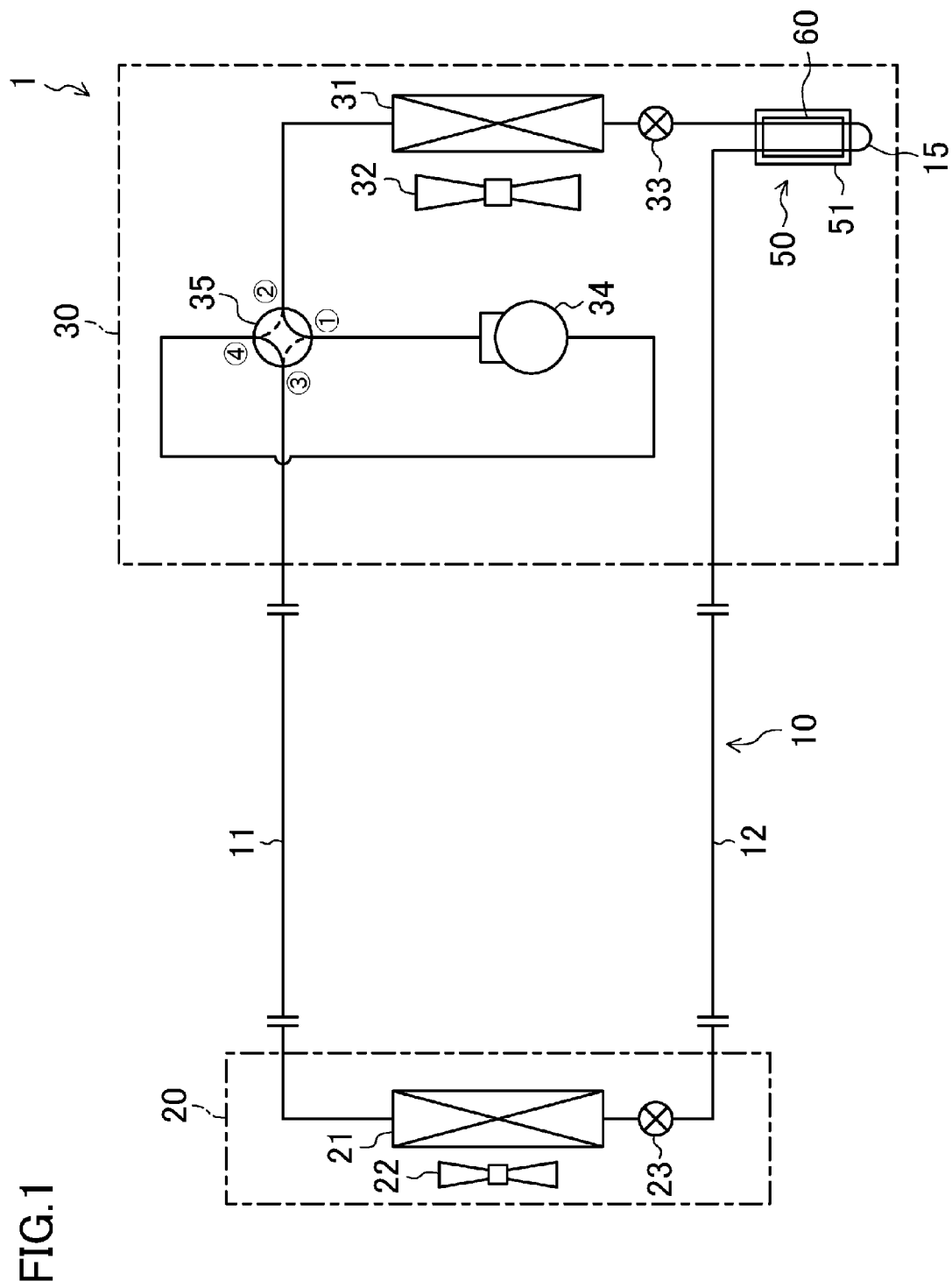
FIG. 1 is a refrigerant circuit diagram showing a schematic configuration of an air conditioner of an embodiment of the present invention.

Embodiments of a refrigerating apparatus of the present invention will be described below, based on the drawings. An air conditioner will be described below as an example of the refrigerating apparatus of the present invention, but the refrigerating apparatus of the present invention is not limited to the air conditioner.

First Embodiment of Invention

An air conditioner (1) has a refrigerant circuit (10) which performs a vapor compression refrigeration cycle by circulating a refrigerant, and is configured to switch a cooling operation and a heating operation. Specifically, the air conditioner (1) includes an indoor unit (20) installed in a room, and an outdoor unit (30) installed outside the room. The indoor unit (20) and the outdoor unit (30) are connected by two communication pipes (11, 12), thereby forming the refrigerant circuit (10), which is a closed circuit.

<Indoor Unit>

The indoor unit (20) includes an indoor heat exchanger (21), an indoor fan (22), and an indoor expansion valve (23). The indoor heat exchanger (21) is a cross-fin type fin-and-tube heat exchanger, for example, and air is blown into the indoor heat exchanger (21) by the indoor fan (22). In the indoor heat exchanger (21), heat is exchanged between a refrigerant flowing inside a heat-transfer pipe and air passing outside the heat-transfer pipe. The indoor expansion valve (23) is an electric expansion valve, for example.

<Outdoor Unit>

The outdoor unit (30) includes an outdoor heat exchanger (31), an outdoor fan (32), an outdoor expansion valve (33), a compressor (34), and a four-way switching valve (35). The outdoor heat exchanger (31) is a cross-fin type fin-and-tube heat exchanger, for example, and air is blown into the outdoor heat exchanger (31) by the outdoor fan (32). In the outdoor heat exchanger (31), heat is exchanged between a refrigerant flowing inside the heat-transfer pipe and air passing outside the heat-transfer pipe. The outdoor expansion valve (33) is an electric expansion valve, for example. The compressor (34) is a rotary compressor, such as a scroll compressor, for example. The four-way switching valve (35) has first to fourth ports to switch the direction of circulation of the refrigerant in the refrigerant circuit (10). The four-way switching valve (35) becomes a state in which a first port and a second port are connected together and a third port and a fourth port are connected together in the cooling operation (the state shown in solid line in FIG. 1), and a state in which the first port and the third port are connected together and the second port and the fourth port are connected together in the heating operation (the state shown in broken line in FIG. 1).

The specific configuration of the outdoor unit (30) will be described in detail below. In the description below, for convenience of explanation, the lower side of FIG. 2 is called "front," the upper side "back," the left side "left," and the right side "right," and the vertically upward portion with respect to the drawing sheet is called "upper side," and the vertically downward portion with respect to the drawing sheet is called "lower side."

Figure 2:
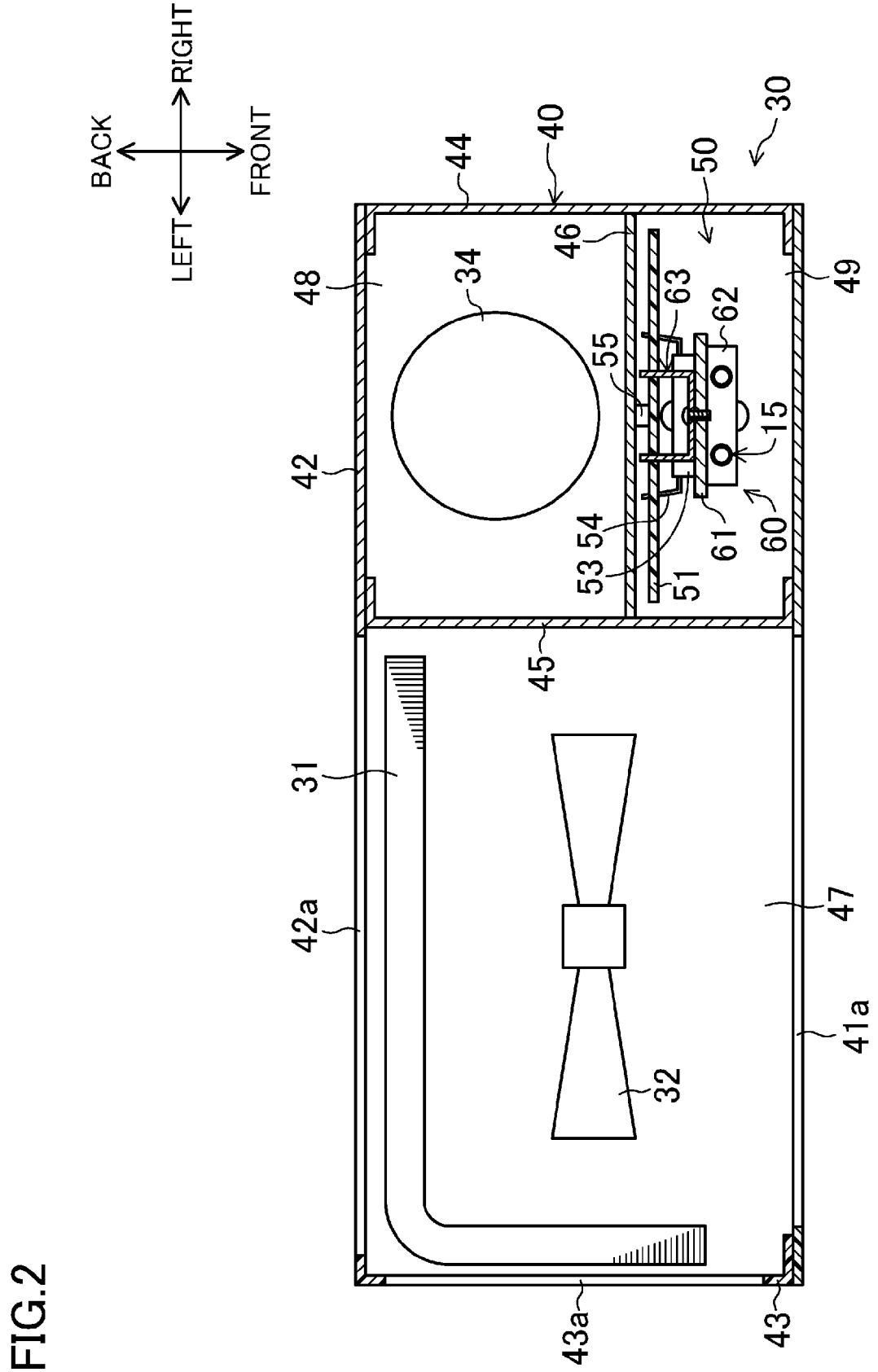
FIG. 2 is a plan view of an outdoor unit of the embodiment.

As shown in FIG. 2, the outdoor unit (30) includes a box-like casing (40). The casing (40) includes a front panel (41), a back panel (42), a left panel (43), and a right panel (44). The front panel (41) is provided at the front side of the outdoor unit (30). The front panel (41) is provided with an outlet (41a) through which outdoor air is blown out. The front panel (41) is capable of being attached to and detached from the casing (40). The back panel (42) is provided at the back side of the outdoor unit (30). The back panel (42) is provided with an inlet (42a) through which the outdoor air is sucked. The left panel (43) is provided at the left side of the outdoor unit (30). The left panel (43) is provided with an inlet (43a). The right panel (44) is provided at the right side of the outdoor unit (30).

The casing (40) includes a front-and-back extending partition plate (45) and a left-and-right extending partition plate (46). The inner space of the casing (40) is divided into two spaces (left and right) by the front-and-back extending partition plate (45) extending from back to front. Of the left and right spaces, the left space forms a heat exchanger chamber (47), and the right space is further divided into two spaces (front and back) by the left-and-right extending partition plate (46). Of the front and back spaces, the back side space forms a compressor chamber (48), and the front side space forms an electrical component chamber (49).

<Components in Electrical Component Chamber>

Figure 3:
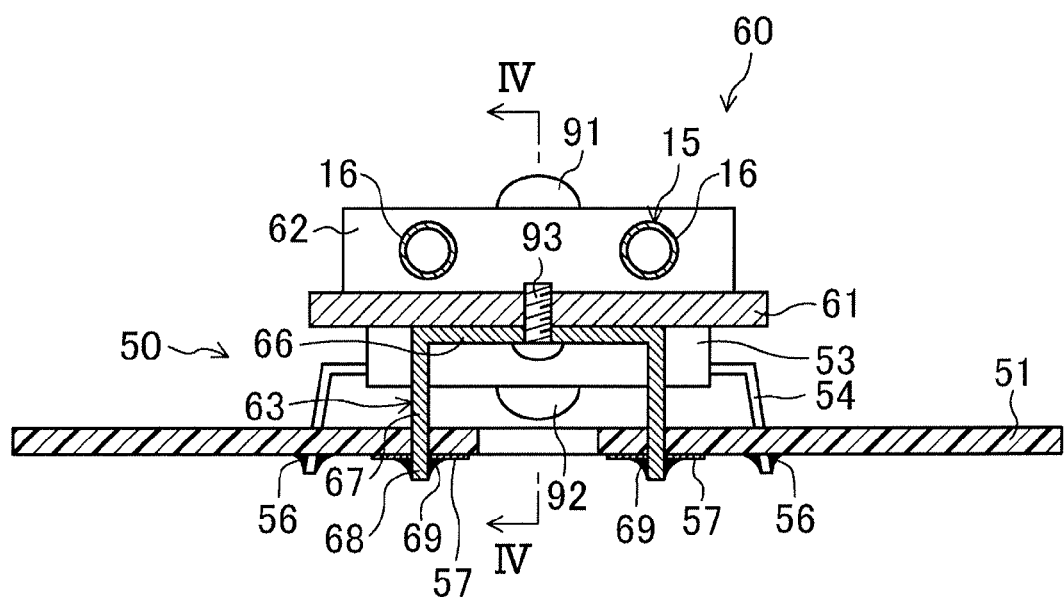
FIG. 3 is an enlarged plan view of components in the electrical component chamber in FIG. 2.

As shown in FIG. 2 and FIG. 3, a printed board (51) on which an electric circuit for controlling various components of the air conditioner (1) is formed, a cooler (60), and a cooling pipe (15) through which the refrigerant of the refrigerant circuit (10) flows, are disposed in the electrical component chamber (49).

Figure 4:
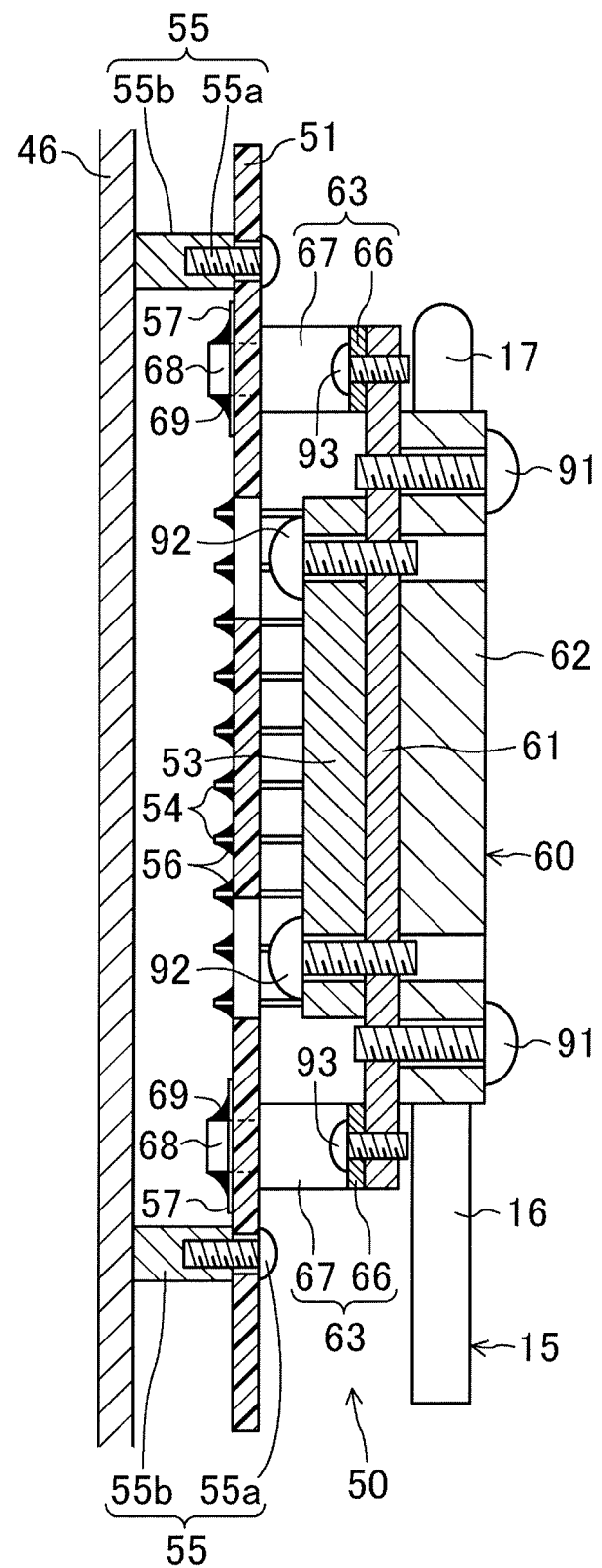
FIG. 4 is a cross-sectional view taken along the line IV-IV of FIG. 3.

The printed board (51) is fixed to the left-and-right extending partition plate (46) by a fixing member (55). As shown in FIG. 4, in the first embodiment, the fixing member (55) is comprised of a screw (55a), and an attachment base (55b) to which the screw (55a) is fastened. The attachment base (55b) is made of a columnar metal object, and is attached to the left-and-right extending partition plate (46) to protrude forward from the left-and-right extending partition plate (46). Further, a screw hole extending from the front surface to the back side is formed in the attachment base (55b). On the other hand, an insertion hole in which the screw (55a) is inserted is formed in the printed board (51). The printed board (51) is fixed to the left-and-right extending partition plate (46) by the screw (55a) inserted into the insertion hole from the front side to the back side and fastened to the screw hole in the attachment base (55b). The printed board (51) is fixed to and supported on the casing (40) by the fixing member (55) in the manner as described above.

Further, a plurality of electronic components including a power module (53), which is provided to form the electric circuit, are mounted on the printed board (51). The electronic components, except the power module (53), are not shown in FIG. 2 through FIG. 4. The plurality of electronic components are mounted on the printed board (51) by the lead line (54). Specifically, as shown in FIG. 3 and FIG. 4, the plurality of electronic components are disposed on the front side of the printed board (51). Further, the plurality of electronic components are mounted on the printed board (51) by the lead line (54) passing through the printed board (51) from the front surface to the back surface and soldered to the back surface of the printed board (51) via a soldered portion (56).

The power module (53) is a switching element of an inverter circuit, for example, and is a heat generating component which generates heat during operation. The power module (53) is attached to the heat transfer plate (61) of the cooler (60), described later, and is cooled by the cooler (60) so that the temperature of the power module (53) does not to exceed a maximum operable temperature (e.g., 90° C.).

The cooler (60) has a heat transfer plate (61) and a cooling jacket (62). The heat transfer plate (61) is made of a metal plate with a high thermal conductivity. The cooling jacket (62) is in an approximately plate-like shape that is flat in the left-and-right direction, and has two long holes inside each having a circular cross section. The two long holes extend from the upper end to the lower end of the cooling jacket (62), and arranged in parallel to each other. Two straight pipe portions (16, 16) of a cooling pipe (15), described later, are fitted in the two long holes. The cooling jacket (62) is fixed to the heat transfer plate (61) by a screw (91) inserted from the front side. Further, the power module (53) is fixed to the heat transfer plate (61) by a screw (92) inserted from the back side.

Further, support members (63) for attaching the cooler (60) to the printed board (51) are attached to the heat transfer plate (61). The two support members (63) are formed into the same shape by bending a tin-plated metal plate into a square U-shape. The support members (63) are respectively attached to an upper end portion and a lower end portion of the back surface of the heat transfer plate (61). Each of the support members (63) has a rectangular attachment portion (66) extending in a transverse direction along the back surface of the heat transfer plate (61), and two support portions (67, 67) extending backward (toward the printed board (51)) from the both ends in the transverse direction of the attachment portion (66). Each of the two support portions (67, 67) of the support member (63) has a tip portion (68) whose width is smaller than the width of its base portion.

The attachment portion (66) of each of the support members (63) is fixed to the heat transfer plate (61) by a screw (93) inserted from the back side. The support members (63) are thereby attached to the heat transfer plate (61). Further, the tip portion (68) of the support portion (67) of the support member (63) is fixed to the printed board (51) by being inserted into a through hole in the printed board (51) from the front side to the back side, and being soldered to the back surface of the printed board (51) via the soldered portion (69). The support members (63) are attached to the printed board (51) in this manner. By fixing the support members (63) to the heat transfer plate (61) and the printed board (51), the cooler (60) having the heat transfer plate (61) is attached to the printed board (51) and supported on the printed board (51).

The through hole in the printed board (51) for inserting the support portion (67, 67) of the support member (63) is slightly wider than the width of the tip portion (68, 68) of the support portion (67, 67). The tip portion (68) of the support member (63) is inserted into the through hole, and part of the tip portion (68) having passed through the through hole is deformed. Thus, the tip portion (68, 68) of the support portion (67, 67) having passed through the through hole is caught at the printed board (51) and does not come out of the through hole. Since the tip portion (68, 68) of the support portion (67, 67) is caught at the printed board (51), the heat transfer plate (61) to which the support members (63) and the power module (53) are attached is temporarily attached to the printed board (51). That is, the tip portion (68, 68) of the support portion (67, 67) forms a retaining portion which prevents the support member (63) from coming off from the printed board (51).

Further, the through hole in the printed board (51) for inserting the support portion (67) of the support member (63) is formed to pass through a ground layer (57) of the printed board (51). In other words, the support portion (67) passing through the printed board (51) and soldered to the printed board (51) passes through the ground layer (57) of the printed board (51) via the soldered portion (69). This means that the support member (63) is conductive with the ground layer (57) of the printed board (51), and that the cooler (60) attached to the printed board (51) by the support member (63) is grounded.

As shown in FIG. 1, the cooling pipe (15) forms part of the refrigerant pipe of the refrigerant circuit (10). The cooling pipe (15) of the present embodiment is connected to a liquid pipe in the refrigerant circuit (10). That is, a high-pressure liquid refrigerant condensed in the heat exchangers (21, 31) flows in the cooling pipe (15).

As shown in FIG. 2 through FIG. 4, the cooling pipe (15) includes two straight pipe portions (16, 16) and a U-shaped pipe portion (17) which connects ends of the straight pipe portions (16, 16). The two straight pipe portions (16, 16) are fitted into the two long holes formed in the cooling jacket (62). A heat transfer grease (not shown) is disposed between the two straight pipe portions (16, 16) of the cooling pipe (15) and the cooling jacket (62) (i.e., wall surfaces forming the two long holes (65)). The heat transfer grease fills a fine gap between the cooling pipe (15) and the cooling jacket (62), thereby reducing a contact thermal resistance between the cooling pipe (15) and the cooling jacket (62), and promoting heat transfer between the cooling pipe (15) and the cooling jacket (62). The cooling pipe (15) is disposed in the electrical component chamber (49) in the casing (40), together with the cooling jacket (62) prior to the installment of a board unit (50) described later. Further, before the installment of the board unit (50), the cooling pipe (15) is tilted toward the front side such that its upper portion is located closer to the front side than its lower portion, and after the board unit (50) is installed behind the cooling pipe (15), the cooling pipe (15) is returned to its original upright position (see FIG. 2), using the elasticity.

—Operation—

Operations of the air conditioner (1) will be described with reference to FIG. 1. The air conditioner (1) switches between a cooling operation and a heating operation.

<Cooling Operation>

In the cooling operation, the refrigerant compressed in the compressor (34) is condensed in the outdoor heat exchanger (31). The condensed refrigerant passes the fully-opened outdoor expansion valve (33), for example, and flows in the cooling pipe (15).

The power module (53) generates heat during operation of the compressor (34). Thus, heat of the power module (53) is sequentially transmitted to the heat transfer plate (61), the heat transfer grease, and the cooling pipe (15), and is dissipated to the refrigerant flowing in the cooling pipe (15). As a result, the power module (53) is cooled and the temperature of the power module (53) is maintained at a predetermined temperature at which the power module (53) is operable.

The refrigerant having flowed in the cooling pipe (15) is decompressed by the indoor expansion valve (23), and then evaporates in the indoor heat exchanger (21). As a result, indoor air is cooled. The evaporated refrigerant is sucked in and compressed by the compressor (34).

<Heating Operation>

In the heating operation, the refrigerant compressed by the compressor (34) is condensed in the indoor heat exchanger (21). As a result, indoor air is heated. The condensed refrigerant passes through the fully-opened indoor expansion valve (23), for example, and flows in the cooling pipe (15). Similarly to the cooling operation, the refrigerant flowing in the cooling pipe (15) absorbs heat from the power module (53) and cools the power module (53). The refrigerant having flowed in the cooling pipe (15) is decompressed by the outdoor expansion valve (33), and then evaporates in the outdoor heat exchanger (31). The evaporated refrigerant is sucked in and compressed by the compressor (34).

—Assembly of Components to Printed Board—

First, the support members (63) are fixed to an upper and lower portions of the heat transfer plate (61). Each of the support members (63) is fixed to the heat transfer plate (61) by the screw (93) inserted into the insertion hole in the attachment portion (66) from the back side to the front side, and fastened to the screw hole in the heat transfer plate (61). Further, the power module (53) is attached to the heat transfer plate (61). The power module (53) is attached to the heat transfer plate (61) such that the power module (53) is in thermal contact with the heat transfer plate (61) by the screw (92) inserted from the back side to the front side of the power module (53) and fastened to the screw hole in the heat transfer plate (61), with a heat-dissipating surface (the front surface) of the power module (53) in contact with the back surface of the heat transfer plate (61) (see FIG. 4).

Next, the heat transfer plate (61) to which the support member (63) and the power module (53) are attached is temporarily attached to the printed board (51). Specifically, the lead line (54) of the power module (53) and the tip portions (68, 68) of the support portions (67, 67) of the support member (63) are inserted in the through holes formed in the printed board (51), and the tip portions (68, 68) of the support portions (67, 67) having passed through the through holes are bent to be caught at the printed board (51), thereby preventing the tip portions (68, 68) from coming off from the through holes. The heat transfer plate (61) to which the support member (63) and the power module (53) are attached is temporarily attached to the printed board (51) by the tip portions (68, 68) of the support portions (67, 67) caught at the printed board (51).

After the temporary attachment, the lead lines (54) of the power module (53) and other electronic components, and the tip portions (68, 68) of the support portions (67, 67) of the support member (63) are fixed to the printed board (51) by soldering. These components are soldered by letting the printed board (51) go through a flow furnace. Specifically, the back surface of the printed board (51) is dipped in a soldering pot of the flow furnace to make the melted solder enter into the through holes in which the tip portions (68, 68)

of the support portions (67, 67) and the lead lines of the power module (53) and other electronic components are inserted, from the back surface of the printed board (51). Since the tip portions (68, 68) of the support portions (67, 67) of the support member (63) form a retaining portion which prevents the support member (63) from coming off from the printed board (51) as described above, the support member (63) and the power module (53) are not separated from the printed board (51) at the time of soldering as a result of dipping the back surface of the printed board (51) in the soldering pot of the flow furnace. Thus, the support member (63) and the power module (53) are reliably soldered.

The board unit (50) having the printed board (51) to which various components are assembled as described above is transferred to an installation site, and installed in the casing (40).

—Installation of Board Unit—

The board unit (50) is installed in the casing (40) after arrangement of various refrigerant pipes forming part of the refrigerant circuit (10). Thus, before installation of the board unit (50), the cooling pipe (15) is disposed in the electrical component chamber (49), and the cooling jacket (62) is provided to wrap around the two straight pipe portions (16, 16) of the cooling pipe (15).

First, the board unit (50) is inserted in a space behind the cooling pipe (15) in the electrical component chamber (49) in the casing (40). At this moment, the cooling pipe (15) arranged in advance is tilted toward the front side to increase a gap between the cooling pipe (15) and the casing (40). The board unit (50) is inserted from the increased gap so as not to touch the cooling pipe (15) and the cooling jacket (62), and is fixed to the left-and-right extending partition plate (46) on the back side of the cooling jacket (62), with the fixing member (55) interposed therebetween (see FIG. 2).

After the board unit (50) is fixed to the casing (40), the heat transfer plate (61) and the cooling jacket (62) are fixed to each other. Specifically, first, the cooling pipe (15) tilted toward the front side is returned to its original upright position, using the elasticity. Then, the back surface of the cooling jacket (62) attached to the cooling pipe (15) is brought into contact with the front surface of the heat transfer plate (61), and the screw (91) is inserted from the front-to-back direction of the cooling jacket (62) and is fastened in the screw hole in the heat transfer plate (61). The cooling jacket (62) is therefore attached to the heat transfer plate (61) such that the cooling jacket (62) is in thermal contact with the heat transfer plate (61) (see FIG. 4).

The board unit (50) is installed in the casing (40) in the manner as described above. Here, the cooler (60) is attached to the printed board (51) by the support members (63), and the printed board (51) is attached to the casing (40) by the fixing member (55). That is, the cooler (60) and the printed board (51) are attached to the casing (40).

—Loads Applied to Lead Line of Power Module—

The compressor (34) having an electric motor vibrates in the cooling operation and the heating operation due to operation of the electric motor. The vibrations is transmitted to the cooler (60) by way of the refrigerant pipe of the refrigerant circuit (10). Thus, in the case, for example, where the cooler (60) vibrates in the state where the printed board (51) does not vibrate, an excess load is applied to the lead line (54) soldered to the printed board (51) of the power module (53) attached to the cooler (60).

In contrast, in the present embodiment, the cooler (60) is attached to the printed board (51) by the support member (63). Thus, even if the vibrations are transmitted to the cooler (60) by way of the refrigerant pipe, the cooler (60) and the printed board (51) vibrate in the same manner. For this reason, an excess load is not applied to the lead line (54) of the power module (53).

Effects of First Embodiment

In the first embodiment, the cooler (60) attached to the cooling pipe (15) and the power module (53) is attached to the printed board (51) by the support member (63), and the printed board (51) is attached to the casing (40) by the fixing member (55). Thus, the cooler (60) and the printed board (51) can be supported on the casing (40) without a switch box of conventional cases interposed therebetween, and an excess load is not applied to the lead line (54) of the power module (53). In this structure, various components do not need to be assembled within the switch box as in the conventional cases, and therefore, it is possible to simplify the process of assembling components to the printed board (51). Further, since it is not necessary to provide a switch box in the casing (40), the printed board (51) can be installed without a difficult insertion work and without interruption of the view of the worker by the switch box. Thus, the process of assembling the components to the printed board (51) and its installment process can be significantly simplified.

Further, in the first embodiment, since the plurality of electronic components including the power module (53) are placed on only one side, i.e., the back surface, of the printed board (51) as a soldering surface, all the electronic components can be easily mounted on the printed board (51), using the flow furnace. The process of assembling the components to the printed board (51) can therefore be simplified.

In the first embodiment, the support member (63) is attached to the printed board (51) by being soldered to the back surface of the printed board (51), similarly to the plurality of electronic components. Thus, the support member (63) and the plurality of electronic components can be fixed to the printed board (51) by soldering them to only one side, i.e., the back surface, of the printed board (51). That is, since the support member (63) and the plurality of electronic components can be easily fixed to the printed board (51), using the flow furnace, the process of assembling the components to the printed board (51) can be simplified.

In the first embodiment, the support portion (67) of the support member (63) which passes through the printed board (51) and is soldered to the back surface of the printed board (51), passes through the ground layer (57) of the printed board (51). The support member (63) is therefore conductive with the ground layer (57) of the printed board (51), and the cooler (60) attached to the printed board (51) by the support member (63) can be reliably grounded.

In the first embodiment, the tip portion (68) of the support portion (67) of the support member (63) forms the retaining portion which prevents the support portion (67) from coming off from the printed board (51). Thus, in soldering the back surface of the printed board (51) by dipping it in the soldering pot of the flow furnace, separation of the support member (63) and the power module (53) from the printed board (51) can be prevented. The support member (63) and the power module (53) can therefore be reliably fixed to the printed board (51) by soldering.

Second Embodiment of Invention

Figure 5:
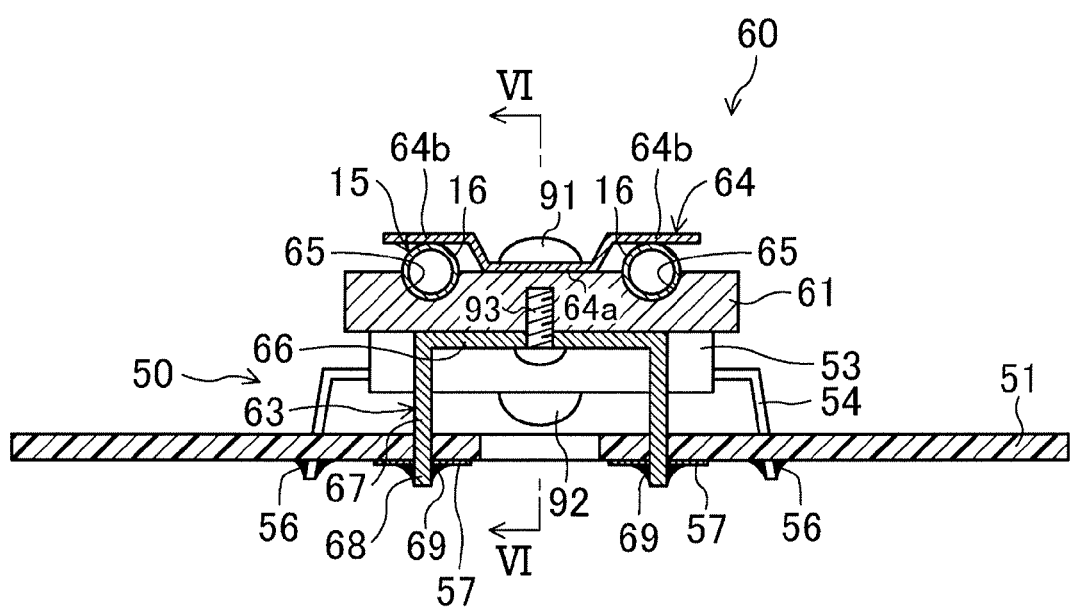
FIG. 5 is an enlarged plan view of components in an electrical component chamber in an outdoor unit of the second embodiment.
Figure 6:
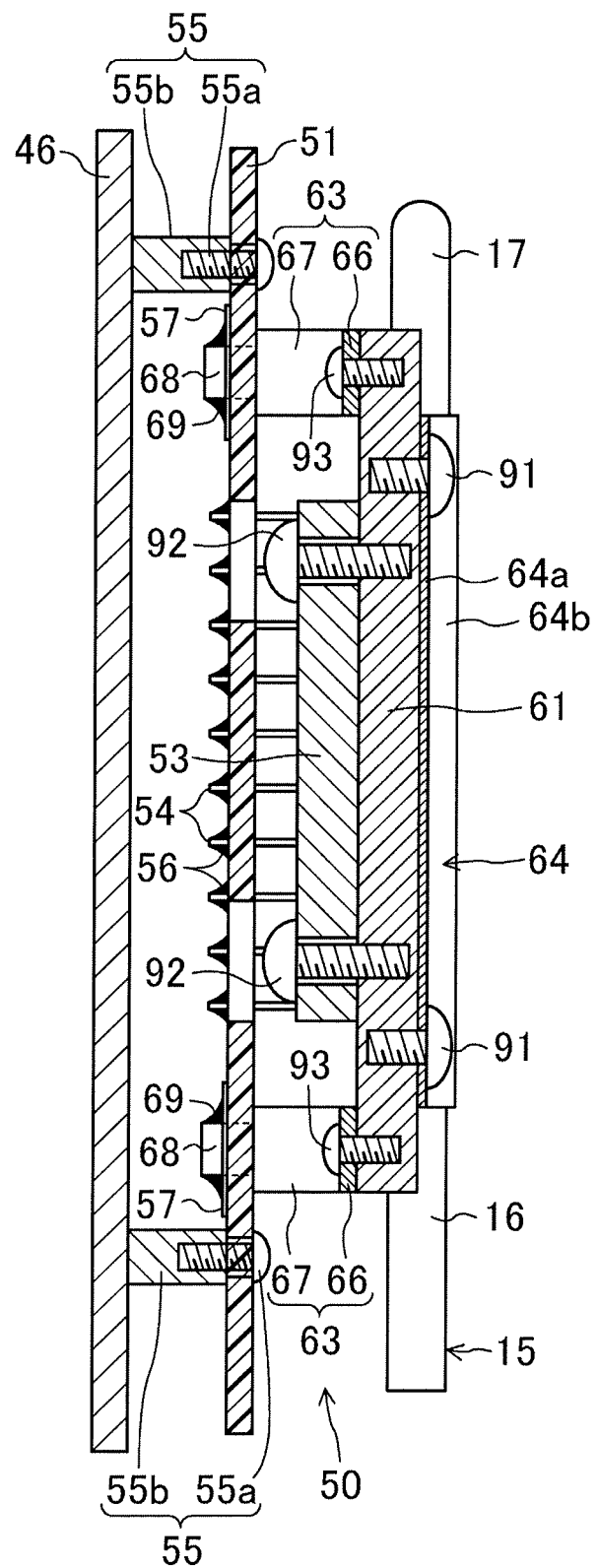
FIG. 6 is a cross-sectional view taken along the line VI-VI of FIG. 5.

An air conditioner (1) of the second embodiment differs from the air conditioner (1) of the first embodiment in the configuration of the cooler (60). Specifically, as shown in FIG. 5 and FIG. 6, the cooler (60) includes a heat transfer plate (61) with a groove (65) in which the cooling pipe (15) is fitted, and a push plate (64) which pushes the cooling pipe (15) toward the heat transfer plate (61).

The heat transfer plate (61) is made of a metal material with a high thermal conductivity, such as aluminum, and formed into a long plate-like shape. Grooves (65) are formed in a front surface of the heat transfer plate (61), for fitting therein two straight pipe portions (16, 16) of the cooling pipe (15). The grooves (65) extend in a longitudinal direction of the heat transfer plate (61), and has cross sections in which the straight pipe portions (16) of the cooling pipe (15) are fitted. A heat transfer grease (not shown) is disposed between the cooling pipe (15) and the groove (65). The heat transfer grease fills a fine gap between the cooling pipe (15) and the groove (65), thereby reducing a contact thermal resistance between the cooling pipe (15) and an inner surface of the groove (65) in the heat transfer plate (61), and promoting heat transfer between the cooling pipe (15) and the heat transfer plate (61).

Further, similarly in the first embodiment, two support members (63) for attaching the cooler (60) to the printed board (51) are attached to the heat transfer plate (61). The support members (63) are fixed to the heat transfer plate (61) by a screw (93) inserted from the back side. Further, a power module (53) is fixed to the heat transfer plate (61) by a screw (92) inserted from the back side.

The push plate (64) is formed by bending a rectangular metal plate plated with zinc. The push plate (64) has a recess (64a) that is recessed toward the heat transfer plate (61) at a middle portion in the width direction, and both lateral sides of the recess (64a) form flat portions (64b, 64b). The recess (64a) extends from one end to the other end in the longitudinal direction, and has an approximately trapezoidal cross section. The push plate (64) is provided on the front side of the heat transfer plate (61), and is attached to the heat transfer plate (61) such that the push plate (64) is in thermal contact with the heat transfer plate (61) by a screw (91) inserted from the front side to the back side and fastened to a screw hole in the heat transfer plate (61), with the bottom surface of the recess (64a) in contact with the heat transfer plate (61).

Since being formed by bending the metal plate as described above, the push plate (64) has a plurality of bent portions extending linearly in the longitudinal direction. The bent portions serve as reinforcement ribs which increase the stiffness of the push plate (64) in the longitudinal direction. Therefore in this structure, the stiffness of the push plate (64) in the longitudinal direction is greater than the stiffness of the push plate (64) in the width direction. The bent portions may have an approximately U-shaped bent portion.

When the push plate (64) is fixed to the heat transfer plate (61) by the screw (91) as in the above structure, the bottom surface of the recess (64a) comes in contact with the front surface of the heat transfer plate (61). At this moment, the recess (64a) is elastically deformed toward the heat transfer plate (61). Associated with this deformation, the connecting portions between the two flat portions (64b, 64b) and the recess (64a) are also deformed toward the heat transfer plate (61). As a result, the two flat portions (64b, 64b) come in contact with the two straight pipe portions (16, 16) of the cooling pipe (15), and the two straight pipe portions (16, 16) are pushed against the two grooves (61, 61) in the heat transfer plate (61).

The other configurations are the same as those in the first embodiment. Since the way of assembling the components to the printed board (51) is also the same as that in the first embodiment, the explanation thereof is omitted. The board unit (50) to which various components are assembled in the way similar to the way as described in the first embodiment, is transferred to an installation site and is installed in the casing (40).

—How to Install Board Unit—

The board unit (50) is installed in the casing (40) after arrangement of various refrigerant pipes forming part of the refrigerant circuit (10). Thus, the cooling pipe (15) is disposed in the electrical component chamber (49) before installation of the board unit (50).

First, the board unit (50) is inserted in a space behind the cooling pipe (15) in the electrical component chamber (49) in the casing (40). At this moment, the cooling pipe (15) arranged in advance is tilted toward the front side to increase a gap between the cooling pipe (15) and the casing (40). The board unit (50) is inserted from the increased gap so as not to touch the cooling pipe (15), and is fixed to the left-and-right extending partition plate (46) on the back side of the cooling jacket (62), with the fixing member (55) interposed therebetween.

After the board unit (50) is fixed to the casing (40), the cooling pipe (15) is fitted into the groove (65) in the heat transfer plate (61) of the cooler (60). Specifically, first, the cooling pipe (15) tilted toward the front side is returned to its original upright position, using the elasticity, and the two straight pipe portions (16) are fitted to the two grooves (65). After the fitting of the cooling pipe (15) into the grooves (65) in the heat transfer plate (61), the push plate (64) is fixed to the heat transfer plate (61), thereby pushing the two straight pipe portions (16, 16) of the cooling pipe (15) against the two grooves (61, 61) in the heat transfer plate (61). Specifically, first, the bottom surface of the recess (64a) of the push plate (64) is brought into contact with the heat transfer plate (61), and the screw (91) is inserted from the front side to the back side and is fastened to the screw hole in the heat transfer plate (61), thereby attaching the push plate (64) to the heat transfer plate (61) such that the push plate (64) is in thermal contact with the heat transfer plate (61).

The board unit (50) is installed in the casing (40) in this manner. Since the cooler (60) and the printed board (51) are attached to the casing (40) in the second embodiment, as well, similar effects as in the first embodiment can be obtained.

Third Embodiment of Invention

In an air conditioner (1) of the third embodiment, an improvement has been made to the printed board (51), considering the workability during maintenance of the cooler (60).

In the above structure in which the power module (53) and the support member (63) are attached to the cooler (60) by the screws (92, 93) inserted from the printed board (51) side, the power module (53) and the support member (63) can be easily screwed to the cooler (60) by screwing them to the cooler (60) before attachment to the printed board (51) at the time of component assembly, but at the time of maintenance after the component assembly, the printed board (51) may interrupt the access of a screwdriver to the screws (92, 93), and the cooler (60) may not be easily detached.

One way of avoiding this may be forming a through hole for insertion of a screwdriver in the printed board (51) at a location corresponding to the screws (92, 93). However, in the structure in which soldering is performed on the back surface of the printed board (51) by dipping the back surface in the melted solder in the soldering pot, using the flow furnace, as described above, the melted solder may flow out to the front surface through the through hole for insertion of the screwdriver and damage the electronic components including the power module (53), or the solder may adhere to a portion where soldering is not necessary. Alternatively, the through hole for insertion of the screwdriver is not formed at the time of assembly, and is formed in the printed board (51) at the time of maintenance. In this case, the printed board (51) needs to be marked because a portion of the printed board (51) which precisely corresponds to the screws (92, 93) cannot be known after the assembly.

Figure 7:
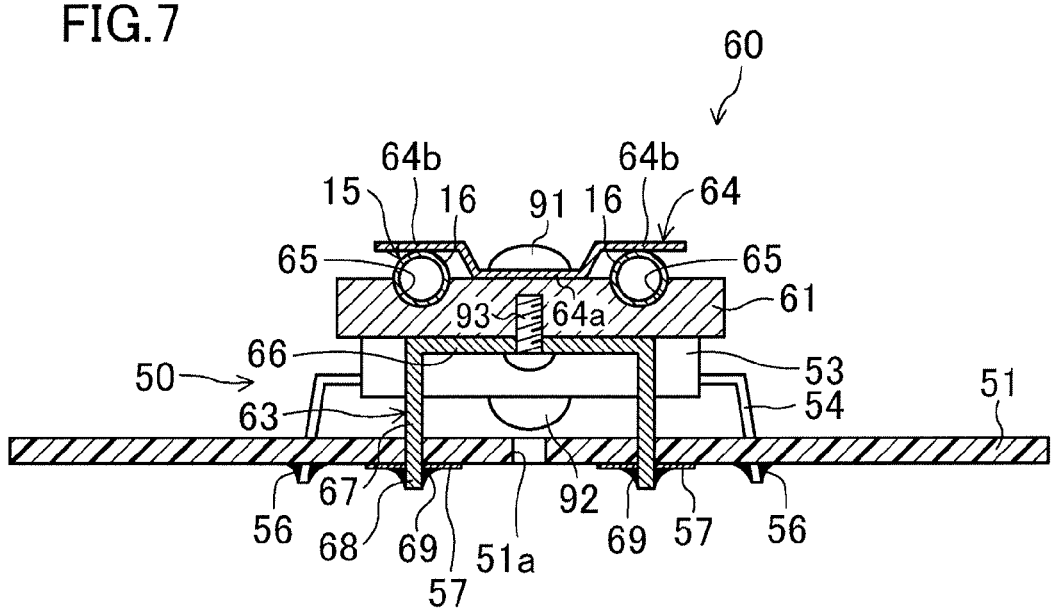
FIG. 7 is an enlarged plan view of components in an electrical component chamber in an outdoor unit of the third embodiment.

In view of this, in the third embodiment, a small hole (51a) is formed in the printed board (51) at a location corresponding to the screws (92, 93) as shown in FIG. 7.

Since the small hole (51a) is formed in the printed board (51) at a location corresponding to the screws (92, 93) in the third embodiment, it is possible to reduce the melted solder flowing out to the front surface during soldering because the diameter of the hole is small, and the through hole for insertion of the screwdriver can be easily formed at the time of maintenance by increasing the size of the small hole (51a) as a mark by drilling, for example. Thus, in the third embodiment, the cooler (60) can be easily detached using the through hole for insertion of the screwdriver formed at the time of maintenance.

Fourth Embodiment of Invention

Figure 8:
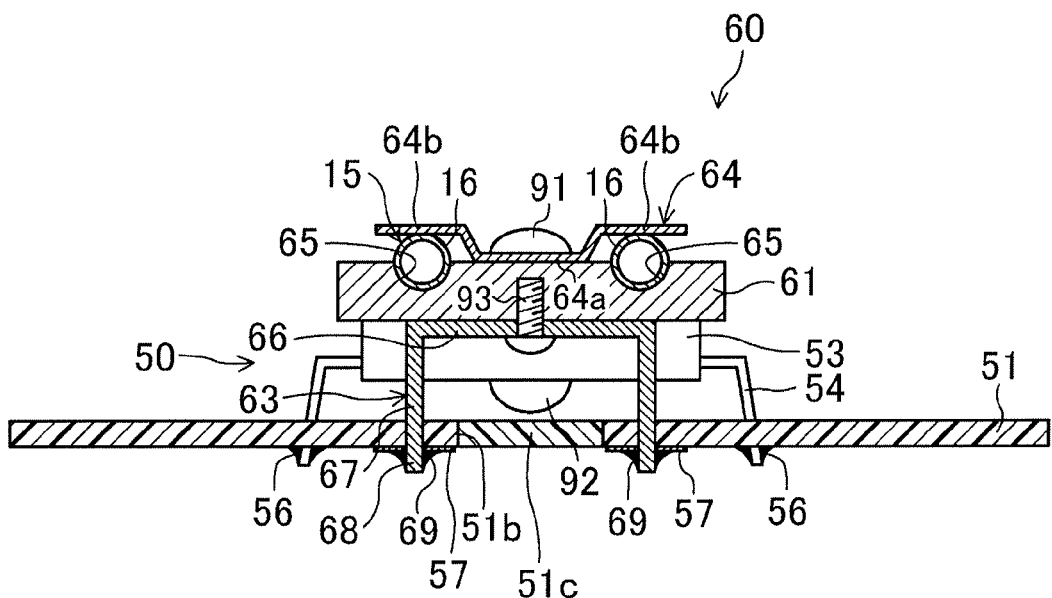
FIG. 8 is an enlarged plan view of components of an electrical component chamber in an outdoor unit of the fourth embodiment.

As shown in FIG. 8, in the fourth embodiment, a cut line (51b) for breakage, instead of the small hole (51a) in the third embodiment, is formed in the printed board (51) at a location corresponding to the screw (92, 93), for forming a through hole in the printed board (51) into which a screwdriver can be inserted at the time of maintenance.

Since the cut line (51b) for breaking the printed board (51) and forming a through hole in the printed board (51) is formed in the printed board (51) at a location corresponding to the screws (92, 93) in the fourth embodiment, it is possible to reduce the melted solder flowing out to the front surface during the soldering because a hole is not formed, and the through hole for insertion of the screwdriver can be easily formed at the time of maintenance by breaking a portion (51c) surrounded by the cut line (51b) along the cut line (51b). Thus, in the fourth embodiment, as well, the cooler (60) can be easily detached using the through hole for insertion of the screwdriver formed at the time of maintenance, similarly to the third embodiment.

Fifth Embodiment of Invention

Figure 9:
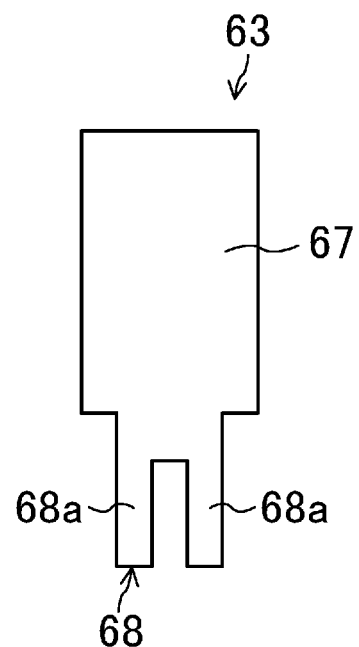
FIG. 9 is a side view of a support portion of a support member of the fifth embodiment.

As shown in FIG. 9, in the fifth embodiment, the shape of the tip portion (68) of the support portion (67) which forms a retaining portion of the support member (63) in the first to fourth embodiments, has been modified.

Specifically, in the fifth embodiment, the tip portion (68) of the support portion (67) has two elongated claws (68a, 68a) which separate from the proximal side to the distal side.

The tip portion (68) of the support portion (67) passes through a through hole in the printed board (51) which is wider than the tip portion (68). After passing through the through hole, the tip portion (68) is twisted and deformed so as not to come off from the through hole.

In this structure of the fifth embodiment, as well, separation of the support member (63) and the power module (53) from the printed board (51) is prevented when the back surface of the printed board (51) is dipped in the soldering pot of the flow furnace for soldering. The support member (63) and the power module (53) are therefore reliably fixed to the printed board (51) by soldering.

Sixth Embodiment of Invention

Figure 10:
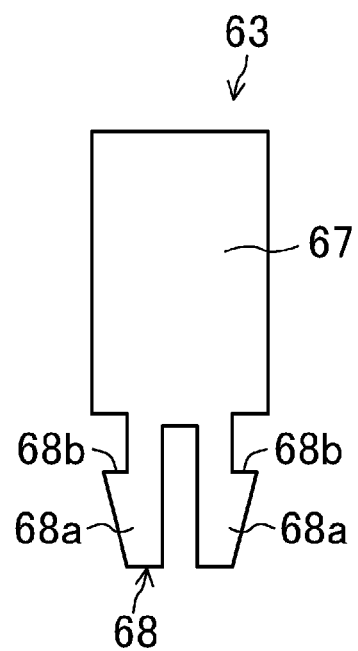
FIG. 10 is a side view of a support portion of a support member of the sixth embodiment.

As shown in FIG. 10, in the sixth embodiment, the shape of the tip portion (68) of the support portion (67) which forms a retaining portion of the support member (63) in the first to fourth embodiments, has been modified.

Specifically, in the sixth embodiment, the tip portion (68) of the support portion (67) has two elongated claws (68a, 68a) which separate from the proximal side to the distal side. Each of the two claws (68a, 68a) is wider at its distal end portion than at its proximal end portion, and has a stepped portion (68b, 68b) at a location between the distal end portion and the proximal end portion. The distal end portion of each of the two claws (68a, 68a) is in a shape of which the width is reduced towards the distal end.

Since having this shape, when the tip portion (68) of the support portion (67) is inserted in the through hole formed in the printed board (51), the two claws (68a, 68a) are deformed to be close to each other so that the tip portion (68) can pass through the through hole whose width is smaller the width of the tip portion (68). At this moment, the tip portion (68) is smoothly inserted in the through hole in the printed board (51), and smoothly passes through the through hole, since each of the two claws (68a, 68a) is in the shape of which the width is reduced towards the distal end. After the distal ends of the two claws (68a, 68a) pass through the through hole in the printed board (51), the two claws (68a, 68a) deformed to be close to each other return to their original shape, i.e., greater in width than the through hole, causing the stepped portions (68b, 68b) to be caught at the printed board (51). As a result, the tip portion (68) of the support portion (67) does not come off from the through hole.

In this structure of the sixth embodiment, as well, separation of the support member (63) and the power module (53) from the printed board (51) is prevented when the back surface of the printed board (51) is dipped in the soldering pot of the flow furnace for soldering. The support member (63) and the power module (53) are therefore reliably fixed to the printed board (51) by soldering.

Seventh Embodiment of Invention

Figure 11:
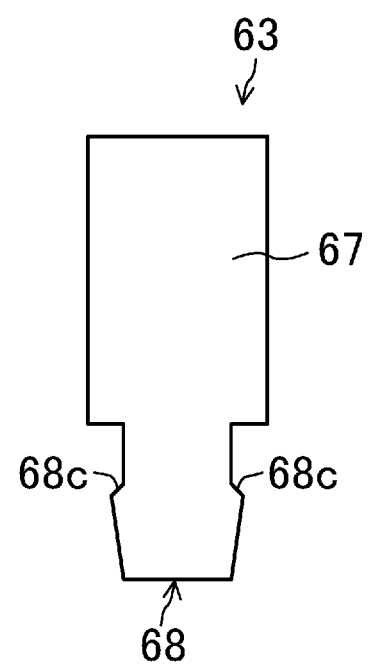
FIG. 11 is a side view of a support portion of a support member of the seventh embodiment.

As shown in FIG. 11, in the seventh embodiment, the shape of the tip portion (68) of the support portion (67) which forms a retaining portion of the support member (63) in the first to fourth embodiments, has been modified.

Specifically, in the seventh embodiment, the distal end portion of the tip portion (68) of the support portion (67) is wider than its proximal end portion, and stepped portions (68c, 68c) are formed between the distal end portion and the proximal end portion. Further, the distal end portion of the tip portion (68) of the support portion (67) is in the shape of which the width is reduced towards the distal end.

Since the width of the distal end portion of the tip portion (68) is reduced towards the distal end, when the tip portion (68) of the support portion (67) is inserted in the through hole formed in the printed board (51), the tip portion (68) smoothly passes through the through hole whose width is smaller than the width of the tip portion (68). After the distal end portion of the tip portion (68) passes through the through hole, the stepped portions (68c, 68c) are caught at the printed board (51), thereby preventing the tip portion (68) from coming off from the printed board (51).

In this structure of the seventh embodiment, as well, separation of the support member (63) and the power module (53) from the printed board (51) is prevented when the back surface of the printed board (51) is dipped in the soldering pot of the flow furnace for soldering. The support member (63) and the power module (53) are therefore reliably fixed to the printed board (51) by soldering.

OTHER EMBODIMENTS

In the above embodiments, the printed board (51) is fixed to the casing (40) by the fixing member (55) comprised of the screw (55*a*) and the attachment base (55*b*). However, the fixing member (55) of the present invention is not limited to the above-described fixing member (55). For example, the fixing member (55) may be hung on and fixed to the casing (40) without using the screw (55*a*).

The retaining portion of the support member (63) of the present invention may be any type as long as it prevents the support member (63) from coming off from the printed board (51). For example, the tip portion (68) of the support member (63) may have a width wider than the width of the through hole in the printed board (51), and the tip portion (68) may be forced into the through hole to serve as a retaining portion.

In the above embodiments, the cooler (60) is connected to a liquid pipe at a location between the indoor expansion valve (23) and the outdoor expansion valve (33) in the refrigerant circuit (10). However, the location where the cooler (60) is connected is not limited to this location. The cooler (60) may be connected at a location between the indoor expansion valve (23) and the indoor heat exchanger (21) in the refrigerant circuit (10), or may be provided at a location between the indoor heat exchanger (21) and the four-way switching valve (35).

In the above embodiments, the air conditioner (1) has been described as an example of the refrigerating apparatus which performs a refrigeration cycle. However, a heat pump type chiller unit, a water heater, or a cooling device for cooling inside air a refrigerator or a freezer, for example, may be used as the refrigerating apparatus.

INDUSTRIAL APPLICABILITY

As described above, the present invention is useful for a refrigerating apparatus having a cooler attached to a refrigerant pipe to cool a heat generating component.

DESCRIPTION OF REFERENCE CHARACTERS

1 air conditioner (refrigerating apparatus)
10 refrigerant circuit
15 cooling pipe (refrigerant pipe)
40 casing
50 board unit
51 printed board
51*a* small hole
51*b* cut line
53 power module (heat generating component)
54 lead line
55 fixing member
56 soldered portion
57 ground layer
60 cooler
63 support member
68 tip portion (retaining portion)
69 soldered portion
92 screw
93 screw

The invention claimed is:

1. A refrigerating apparatus, including:
a refrigerant circuit which performs a refrigeration cycle by circulating a refrigerant;
a printed circuit board on which a heat generating component is mounted;
a cooler attached to the heat generating component and a refrigerant pipe of the refrigerant circuit, for cooling the heat generating component with the refrigerant flowing in the refrigerant pipe; and
a casing in which at least the printed circuit board, the refrigerant pipe, and the cooler are disposed,
the refrigerating apparatus comprising:
a support member attaching the cooler to the printed circuit board in such manner that a load of the cooler is supported by the printed circuit board; and
a fixing member fixing the printed circuit board to the casing in such manner that the printed circuit board is supported by the casing,
wherein the casing supports the load of the cooler by operation of the fixing member which transfers the load of the cooler from the printed circuit board to the casing.

2. The refrigerating apparatus of claim 1, wherein
a plurality of electronic components including the heat generating component are mounted on the printed circuit board, and
the plurality of electronic components are disposed on a first surface of the printed circuit board, and include a lead line which passes through the printed circuit board from the first surface to a second surface opposite to the first surface and a soldered portion which joins the lead line and the second surface together.

3. The refrigerating apparatus of claim 2, wherein
the support member is made of a metal material, and includes an attachment portion that is attached to the cooler on the first surface of the printed circuit board, a support portion that is continuous with the attachment portion, passes through the printed circuit board, and a soldered portion which joins the support portion and the second surface together.

4. The refrigerating apparatus of claim 3, wherein
the support portion passes through a ground layer of the printed circuit board.

5. The refrigerating apparatus of claim 4, wherein
the support portion includes a retaining portion which prevents the support portion from coming off from the printed circuit board.

6. The refrigerating apparatus of claim 5, wherein
the heat generating component and the support member are attached to a surface of the cooler facing the printed circuit board by screws inserted from the printed circuit board side, and
a small hole is formed in the printed circuit board at a location corresponding to the screws.

7. The refrigerating apparatus of claim 5, wherein
the heat generating component and the support member are attached to a surface of the cooler facing the printed circuit board by screws inserted from the printed circuit board side, and
a cut line for breaking the printed circuit board and forming a through hole is formed in the printed circuit board at a location corresponding to the screws.

8. The refrigerating apparatus of claim 4, wherein
the heat generating component and the support member are attached to a surface of the cooler facing the printed circuit board by screws inserted from the printed circuit board side, and
a small hole is formed in the printed circuit board at a location corresponding to the screws.

9. The refrigerating apparatus of claim 4, wherein
the heat generating component and the support member are attached to a surface of the cooler facing the printed circuit board by screws inserted from the printed circuit board side, and
a cut line for breaking the printed circuit board and forming a through hole is formed in the printed circuit board at a location corresponding to the screws.

10. The refrigerating apparatus of claim 3, wherein
the support portion includes a retaining portion which prevents the support portion from coming off from the printed circuit board.

11. The refrigerating apparatus of claim 10, wherein
the heat generating component and the support member are attached to a surface of the cooler facing the printed circuit board by screws inserted from the printed circuit board side, and
a small hole is formed in the printed circuit board at a location corresponding to the screws.

12. The refrigerating apparatus of claim 10, wherein
the heat generating component and the support member are attached to a surface of the cooler facing the printed circuit board by screws inserted from the printed circuit board side, and
a cut line for breaking the printed circuit board and forming a through hole is formed in the printed circuit board at a location corresponding to the screws.

13. The refrigerating apparatus of claim 3, wherein
the heat generating component and the support member are attached to a surface of the cooler facing the printed circuit board by screws inserted from the printed circuit board side, and
a small hole is formed in the printed circuit board at a location corresponding to the screws.

14. The refrigerating apparatus of claim 3, wherein
the heat generating component and the support member are attached to a surface of the cooler facing the printed circuit board by screws inserted from the printed circuit board side, and
a cut line for breaking the printed circuit board and forming a through hole is formed in the printed circuit board at a location corresponding to the screws.

15. The refrigerating apparatus of claim 2, wherein
the heat generating component and the support member are attached to a surface of the cooler facing the printed circuit board by screws inserted from the printed circuit board side, and
a small hole is formed in the printed circuit board at a location corresponding to the screws.

16. The refrigerating apparatus of claim 2, wherein
the heat generating component and the support member are attached to a surface of the cooler facing the printed circuit board by screws inserted from the printed circuit board side, and
a cut line for breaking the printed circuit board and forming a through hole is formed in the printed circuit board at a location corresponding to the screws.

17. The refrigerating apparatus of claim 1, wherein
the refrigerant pipe is a liquid pipe of the refrigerant circuit.

* * * * *